United States Patent
Aebischer

[19]

[11] Patent Number: 5,770,962
[45] Date of Patent: Jun. 23, 1998

[54] BIAS CIRCUIT INTENDED TO DETERMINE THE MEAN LEVEL OF AN AC VOLTAGE

[75] Inventor: Daniel Aebischer, Neuchâtel, Switzerland

[73] Assignee: Centre Suisse D'Electronique et de Microtechnique SA, Neuchatel, Switzerland

[21] Appl. No.: 705,664

[22] Filed: Aug. 30, 1996

[30] Foreign Application Priority Data

Aug. 31, 1995 [FR] France ................... 94 10262

[51] Int. Cl.⁶ .................................................. H03K 17/16
[52] U.S. Cl. ........................................ 327/307; 327/319
[58] Field of Search .............................. 327/307, 344, 327/345, 355, 361, 306, 315, 316, 319

[56] References Cited

U.S. PATENT DOCUMENTS

| | | | |
|---|---|---|---|
| 4,229,703 | 10/1980 | Bustin | 327/307 |
| 4,814,644 | 3/1989 | Yamakawa | 327/64 |
| 4,914,316 | 4/1990 | Rossi et al. | 327/538 |
| 5,113,129 | 5/1992 | Hughes | 323/316 |
| 5,333,093 | 7/1994 | Krautschneider et al. | 327/309 |

FOREIGN PATENT DOCUMENTS 0570820  11/1993  European Pat. Off. .

*Primary Examiner*—Timothy P. Callahan
*Assistant Examiner*—T. T. Lam

[57] ABSTRACT

A circuit that includes a series arrangement of a capacitive element (C) and an active component (M10) forming an equivalent resistor. A DC current source (12) is connected to the active component, and a transistor (M11, 11) is provided for altering the conductance of the active component and fixing the mean level of a AC voltage ($U_{ac}$). Such a voltage is applied to the terminals of the series arrangement, and the biased voltage having the desired mean level ($U_{out}$) is tapped off the node (10) between the capacitive element (C) and the active component. A capacitive voltage divider (13) is also provided for modulating the DC current (i) passing through the active component (M10), with a fraction of the AC voltage to be biased. The circuit is particularly applicable to the determination of the mean level of the voltage produced by a quartz oscillator.

8 Claims, 5 Drawing Sheets

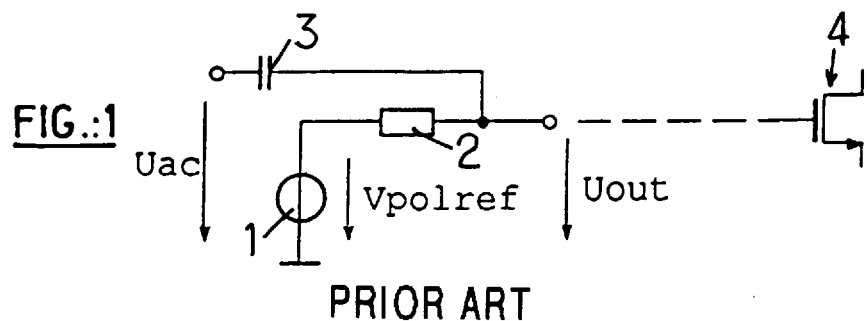
FIG.:1
PRIOR ART
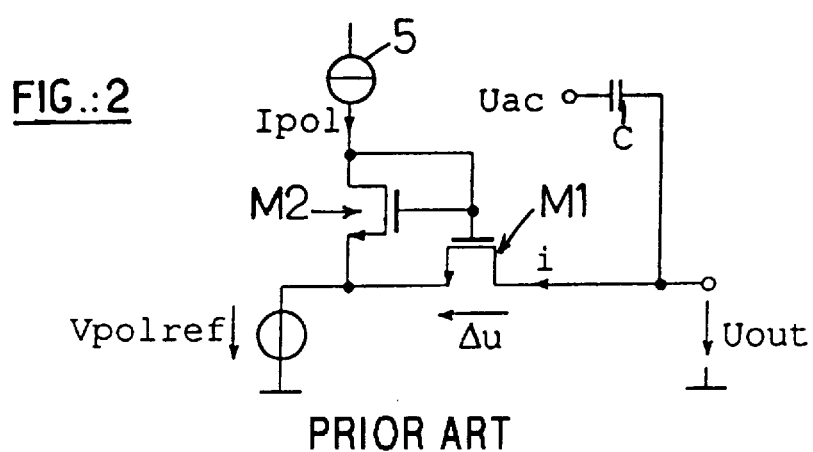
FIG.:2
PRIOR ART
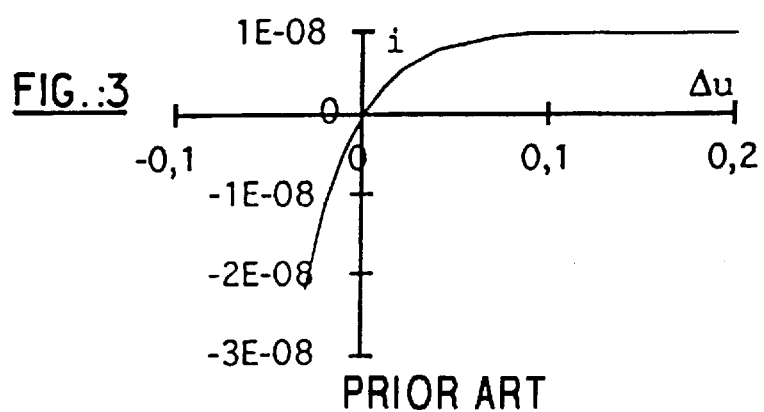
FIG.:3
PRIOR ART

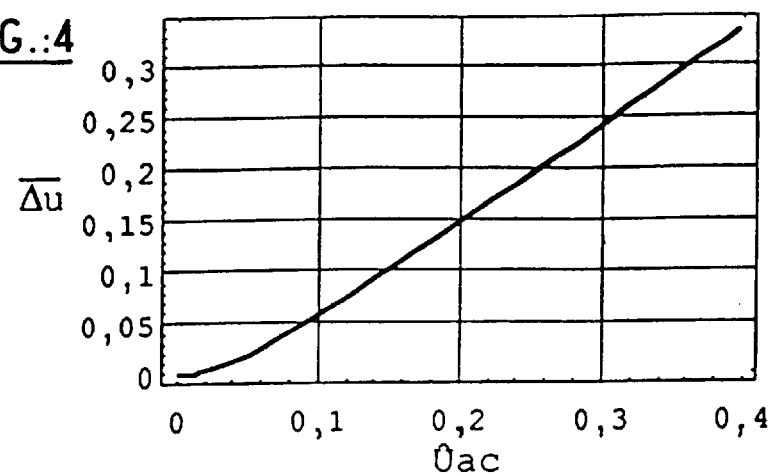
FIG.:4
PRIOR ART
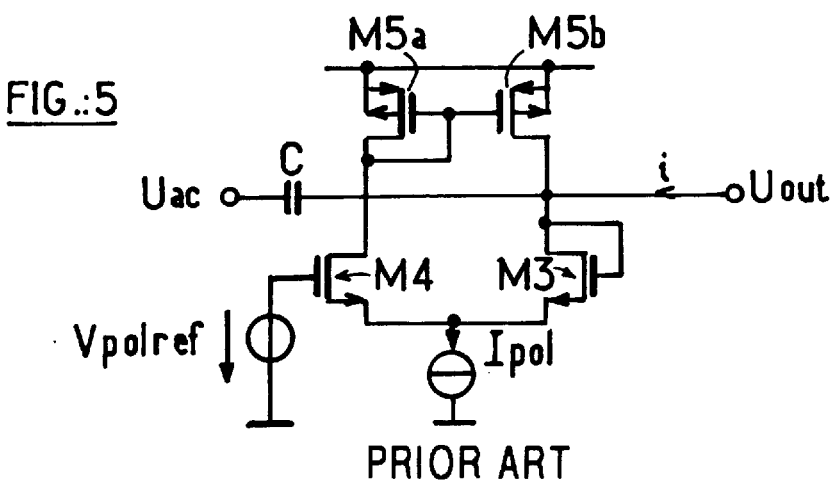
FIG.:5
PRIOR ART
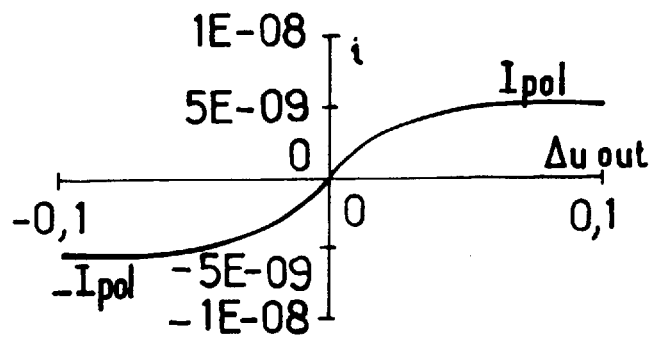
FIG.:6
PRIOR ART

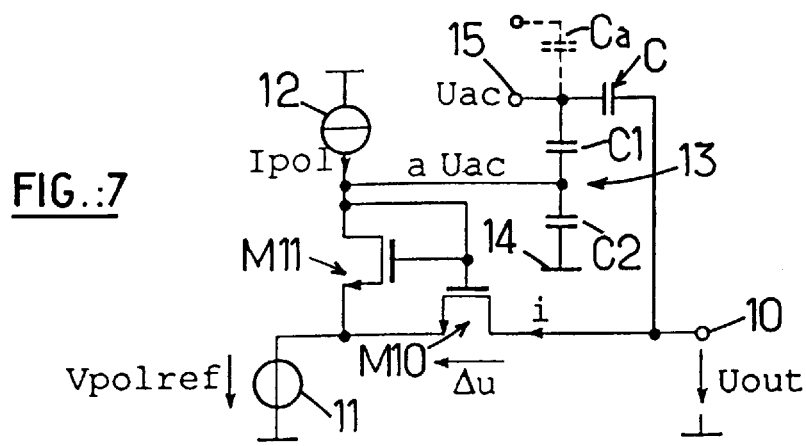
FIG.:7
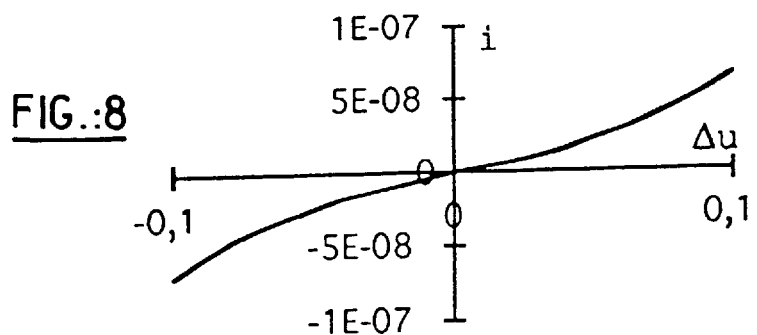
FIG.:8
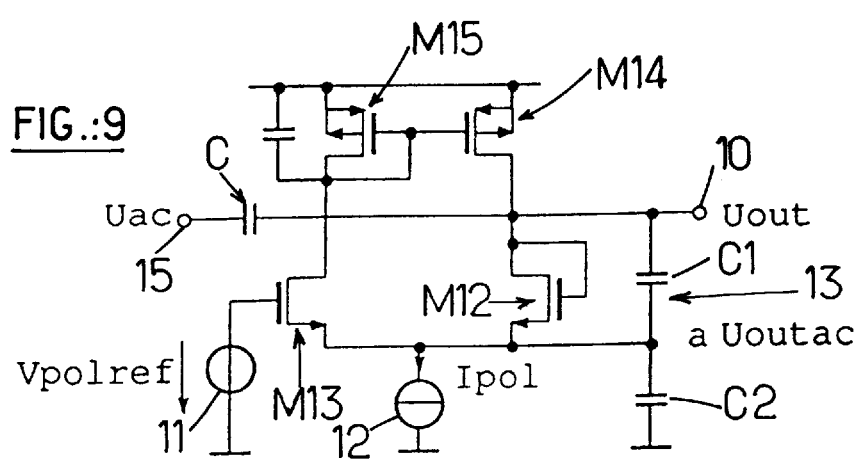
FIG.:9

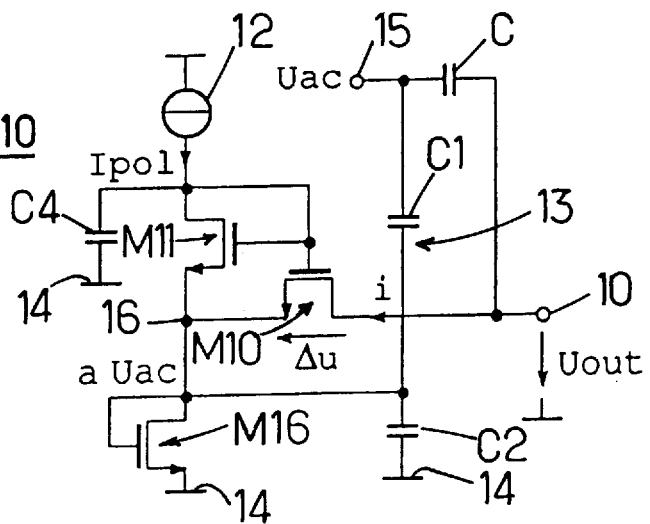
FIG.:10
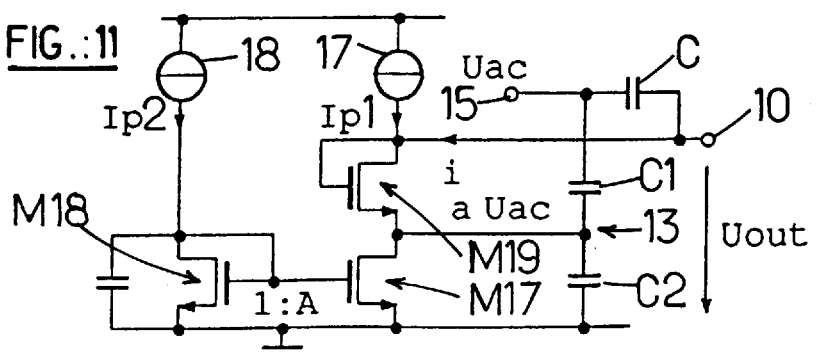
FIG.:11

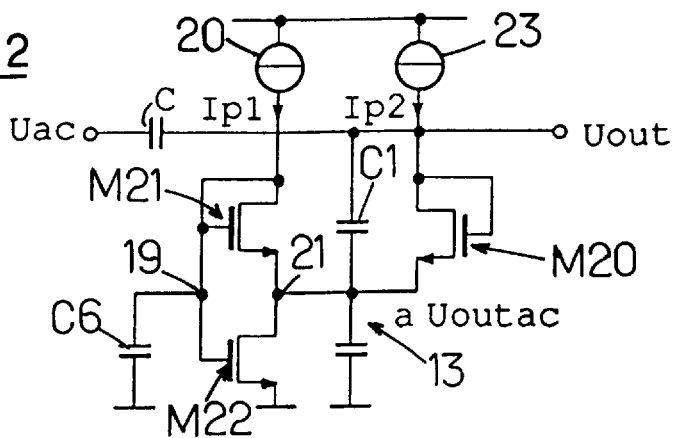
FIG.:12
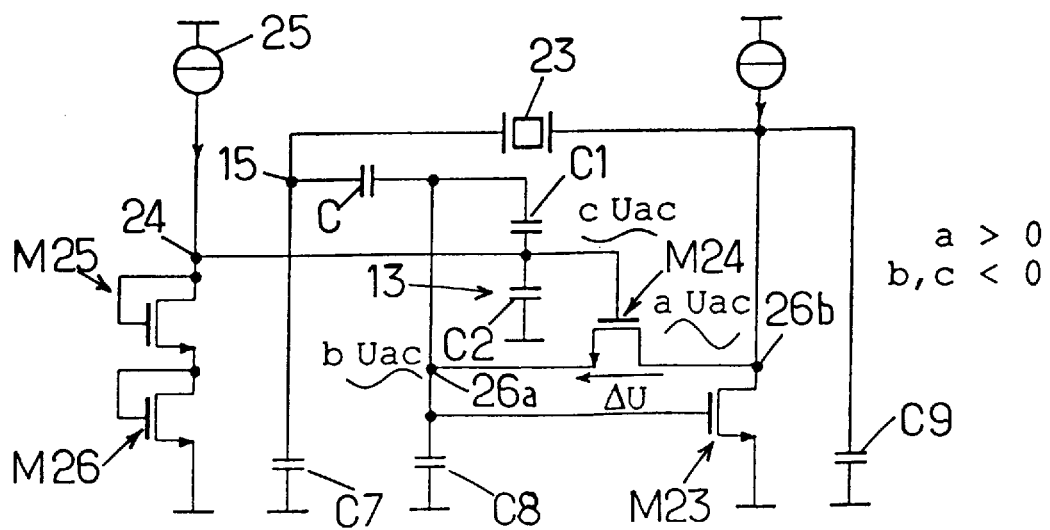
FIG.:13

BIAS CIRCUIT INTENDED TO DETERMINE THE MEAN LEVEL OF AN AC VOLTAGE

FIELD OF THE INVENTION

The present invention relates to the field of integrated circuits which include a bias circuit intended to fix the mean DC level of an AC voltage, in particular a sinusoidal voltage.

More particularly, the invention relates to an interface circuit between an AC voltage source with random mean DC level, and a receiver circuit, which in order to operate, requires an AC voltage whose mean DC level is to be fixed.

BACKGROUND OF THE INVENTION

Such an interface circuit may be used in particular with a quartz oscillator for example which is to form part of a generator of a rectangular signal having an accurately determinable duty ratio. Thus, in such a case, the duty ratio of the signal to be produced depends directly on the mean level of the AC voltage which serves to generate the rectangular signal.

FIG. 1 of the appended drawings shows a wellknown arrangement making it possible to obtain an interface circuit of the kind indicated above. This arrangement comprises a voltage source 1 delivering a bias voltage $V_{polref}$ and connected in series with a resistor 2 and a capacitor 3. The input voltage $U_{ac}$ of random mean level is applied to the terminals of the arrangement, whereas the output voltage $U_{out}$ of accurately determinable mean level appears at the common point between the resistor 2 and the capacitor 3. The voltage $U_{out}$ is applied to an application circuit symbolized here by the transistor 4.

This arrangement has the advantage of simplicity, but it nevertheless has certain drawbacks.

Firstly, the resistor 2 constitutes a load in respect of the AC voltage. Depending on the internal resistance of the source of the input voltage $U_{ac}$ and the cutoff frequency of the device, determined especially by the capacitor 3, this arrangement introduces a decay in the amplitude and an undesirable phase shift of the useful signal.

Moreover, for certain devices such as quartz oscillators, the resistor 2 introduces ohmic losses and gives rise to a reduction in the overall quality factor, this being undesirable both in respect of consumption and frequency stability. In order to allay these prejudicial phenomena, a resistor of high value is needed or an inductor must be used.

However, in an integrated circuit it is not always possible to achieve a high resistance, of the order of several MW for example, other than by occupying considerable space on the chip of the integrated circuit. It may also have a sizable stray capacitance and induce a leakage conductance, for example towards the substrate of the circuit. Moreover, in certain cases, it is not linear.

To attempt to remedy the problems related to the use of a resistor, it has already been proposed to use one or more active components, and especially transistors, instead of the resistor.

FIG. 2 of the appended drawings shows an example of such a circuit. Instead of the resistor 2 of the arrangement of FIG. 1, this known circuit includes a transistor M1 in which a current i flows and at the terminals of which there appears a voltage drop $\Delta u$. The value of the equivalent resistor R formed by the transistor M1 can be determined with the aid of a second transistor M2 which receives a current $I_{pol}$ from a source of constant current 5. The gate of this control transistor M2 is linked to that of the transistor M1 and to its own drain.

In this case, the equivalent resistor R can therefore be determined, for a given input voltage $U_{ac}$ by suitably choosing the current $I_{pol}$ and the dimensions of the transistors M1 and M2.

However, this arrangement exhibits a major problem which lies in the fact that the current/voltage characteristic $i=f(\Delta u)$ of the transistor M1 is not linear, as shown by the graph of FIG. 3 of the appended drawings. FIG. 3 shows this characteristic for a specified gate voltage $V_g$ of the transistor M1. FIG. 4 which depicts the relation between the mean voltage $\Delta u$ versus the peak voltage $\hat{U}_{ac}$, shows that the offset in the mean DC level of the voltage $U_{ac}$ is steeply increasing with the amplitude of the latter, so that a nuisance distortion (here in the positive sense) of this level subsists.

A circuit exhibiting a symmetric transfer characteristic is already known. Such an arrangement is depicted in FIG. 5 of the appended drawings. The arrangement comprises a differential pair consisting of the transistors M3 and M4, supplied via the transistors M5a and M5b, arranged as a current mirror. The gate of the transistor M4 is linked to the output of a voltage source ($V_{polref}$) and that of the transistor M3 is linked to the output ($U_{out}$). The sources of the transistors M3 and M4 are linked to a current source ($I_{pol}$). The circuit constitutes a transconductance amplifier, which is used as an equivalent resistor. Any voltage difference between the gates of the transistors M3 and M4 produces a current i. This circuit makes it possible to obtain a curve $i=f(\Delta u)$, shown in FIG. 6, which is symmetric with respect to the center and therefore, in principle, to maintain the mean DC level of the voltage $U_{out}$ at a stable value.

The drawback of this known circuit lies in the fact that the symmetry of the curve can be obtained only if the conditions are quasi-static, that is to say for a frequency below a predetermined frequency, since then the potentials of the nodes, formed by the sources of the transistors M3 and M4 and by the gate of the transistor M5a have time to become completely steady.

On the other hand, if it is desired to produce a high equivalent resistance, or if it is wished to minimize consumption, the bias current $I_{pol}$ must be low while the stray capacitances of the circuit will have an increasingly apparent influence. This is why, beyond a certain frequency, the characteristic of FIG. 6 loses its symmetry and an offset in level with respect to the nominal level which it is desired to obtain is therefore created, as in the previous case of FIG. 2.

It should be noted that this voltage offset can only be controlled with difficulty, since it depends on the stray capacitances, on the frequency of the signal $U_{ac}$ and on the levels of the currents.

The object of the invention is to provide a bias circuit intended to fix the mean level of an AC voltage and which is free of the drawbacks of the circuits of the prior art.

The subject of the invention is therefore such a circuit comprising the series arrangement of a capacitive element and an active component forming an equivalent resistor, a DC current source joined to this active component and means for altering the conductance of said active component and thus fixing the mean level of said AC voltage, the latter being applied to the terminals of this series arrangement, whereas the biased voltage having said mean level is tapped off from the node between said capacitive element and said active component, this circuit being one which also comprises means for modulating the DC current passing through said active component with a fraction of said AC voltage to be biased.

By virtue of these characteristics, the biased voltage can be ridded of any defect due to the nonlinear transfer characteristic of the active component, and this can be done for operating frequencies of the circuit which are greater than a predetermined frequency.

BRIEF DESCRIPTION OF THE DRAWINGS

Other characteristics and advantages of the invention will emerge in the course of the description which follows, given merely by way of example and made with reference to the appended drawings in which:

FIGS. 1 to 6 already described show via diagrams and graphs several solutions of the prior art;

FIG. 7 depicts the diagram of a first embodiment of the bias circuit according to the invention;

FIG. 8 depicts a current/voltage graph illustrating the operation of the circuit of FIG. 7;

FIGS. 9 to 13 show other embodiments of the bias circuit according to the invention.

DESCRIPTION OF THE PREFERRED EMBODIMENTS

Depicted in FIG. 7 is a first embodiment of the invention according to which the bias circuit comprises a transistor M10 acting as an equivalent resistor and whose drain is connected to the output 10 of the circuit and also to a capacitor C. The source of this transistor M10 is linked to a source 11 of a bias voltage $V_{polref}$ and also to the source of another transistor M11. The gate of the transistor M10 is connected both to that of the transistor M11 and to the drain of the latter. The transistor M10 conducts a current i and engenders a voltage drop Δu between its source and drain terminals.

The bias circuit also comprises a current source 12 sinking a bias current $I_{pol}$ into the transistor M11.

According to the invention, the circuit comprises means making it possible to impose the amplitude and shape of the AC voltage of the signal to be biased on at least one of the nodes of the circuit, or in other words to modulate the current i passing through the transistor M10.

In the circuit of FIG. 7, these means are formed by a capacitive voltage divider 13 comprising two capacitors C1 and C2 in series. This divider is linked between the earth 14 of the circuit and its input 15 to which the AC voltage to be biased is applied. The node between the capacitors C1 and C2 is connected to the node between the current source 12 and the transistor M11.

According to a variant of this circuit, the capacitor C (referenced Ca and represented dashed in FIG. 7), can be connected between the input terminal and the divider 13, rather than between this divider and the output terminal 10. In this case, the point common to the capacitor Ca and to the capacitor C1 is connected to the terminal 10.

In the circuit just described, the AC voltages of all the nodes are fixed by the capacitances of the capacitors of the voltage divider 13 and especially that of the gate of the transistor M10. These voltages are therefore not influenced by the conductances of the various components, such as those of the transistors M10 and M11. Thus, it is possible to use very weak DC bias currents creating likewise very weak conductances in the active elements. These components therefore only very lightly load not only DC but also AC voltage sources.

By thus modulating the gate of the transistor M10 at the same time as its drain, a transfer characteristic of the transistor M10 is obtained, the shape of which results from FIG. 8. It can be seen that, as compared with the characteristic of FIG. 4, this curve takes a dynamic form with very good symmetry in relation to the axes. It should be noted that in this respect there is no need to consider the capacitive components of the current i, since these are zero on average and are therefore not involved in developing the mean DC voltages.

Another noteworthy property of the circuit according to the invention consists in that, contrary to the prior art circuits described above, the proper operation of the circuit can be guaranteed upwards of a certain minimum frequency.

The choice between the circuit configuration using the capacitor C and that using the capacitor Ca depends on the stray capacitances associated with the functional capacitances of the circuit, on the relative magnitudes of these capacitances, on the allowable loads at the input 15 and at the output 10 and on the decay which can be tolerated at the level of the output 10.

The ratio of the voltage divider 13 can be chosen on the basis of requirements. Advantageously, by using a network of capacitors in the integrated circuit, this ratio can be made adjustable by conventional programming techniques. Consequently, the function $D_{Umean}=f(Û_{ac})$ becomes programable.

The bias circuit according to the embodiment of the invention represented in FIG. 9 is of the differential type. In this case, the circuit comprises a pair of N-type transistors M12 and M13 and another pair of P-type transistors M14 and M15, the transistor M12 forming the equivalent resistor R. The current source 12 delivering the current $I_{pol}$ is connected to the sources of the transistors M12 and M13, to which the middle point of the capacitive divider 13 is likewise linked. The source 11 of reference voltage $V_{polref}$ is connected to the gate of the transistor M13. The two transistors M14 and M15 are connected respectively in series with the transistors M12 and M13. The node between the transistors M12 and M14 constitutes the output terminal 10 of the circuit, whereas this output terminal is linked to the input terminal 15 by way of the capacitor C.

The circuit of FIG. 9 has the advantage of requiring a weaker supply voltage than in the case of FIG. 7 for the same voltage $V_{polref}$.

The circuit of FIG. 10 is a variant of the circuit of FIG. 7 in which the node 16 between the transistors M10 and M11 is joined to the drain of a third transistor M16 which is also connected to the middle point of the voltage divider 13. Moreover, this transistor M16 is connected in series with the transistor M11. This series arrangement is connected in parallel with a capacitor C4. In this case, the bias voltage $V_{polref}$ is "implicit" and close to the threshold voltage of the N MOS transistors.

The bias circuit according to the embodiment of FIG. 11 includes a current mirror composed of the transistors M17 and M18. The transistor M19 acts as an equivalent resistor. The node between the transistors M18 and M19 is here connected to the middle point of the voltage divider 13. Each of the branches of the circuit comprises a current source, 17 and 18 resp. The current in the transistor M19 is determined by the current source $I_{p1}$. The current mirror serves to maintain the mean DC potential of the node 13 at a value close to zero.

The bias circuit according to the embodiment of FIG. 12 comprises a transistor M20 acting as an equivalent resistor and two other transistors M21 a M22 linked in series and whose gates form a common node 19 which is earthed via a capacitor C6. This node 19 is also connected to a first current source 20 sinking into the series arrangement of the transistors M21 and M22.

The node 21 between the respective drain and respective source of the transistors M21 and M22 is linked to the middle point of the capacitive divider 13. A second current source 23 sinks into the transistor M20.

FIG. 13 shows another embodiment of the bias circuit in the context of its use in a quartz oscillator.

This arrangement includes a quartz 23 connected to a transistor M23. This arrangement likewise comprises a transistor M24 acting as an equivalent resistor. The gate of this transistor M24 is connected to the middle point of the capacitive divider 13 and also to a bias node 24 which is the junction point between a current source 25 and two bias transistors M25 and M26 which are arranged in series. The gate of the transistor M23 is connected to a node 26a situated between the capacitors C and C1. This node is at a voltage which is in phase opposition with respect to the node 26b between the transistors M23 and M24. Moreover, capacitors C7, C8 and C9 are connected between earth and the respective nodes 15, 25 and 10.

By virtue of the invention, it is therefore possible to impose, with good accuracy, the value of the DC component of an AC voltage or of a difference of AC voltages, without having to use ohmic resistors for this purpose.

For a given amplitude of the input voltage, the value of the equivalent resistor created in the circuits according to the invention can be determined by a current or a voltage.

The bias circuit according to the invention can operate with very weak DC currents. By appropriately dimensioning the transistors of the circuit, it is possible to minimize the ohmic losses due to the real part of the admittance seen by the input voltage at the working frequency. This property is particularly attractive in the circuit of FIG. 13 and more generally in quartz oscillators in which the losses may be particularly troublesome from the standpoint of consumption and frequency stability.

Given that, in the circuit according to the invention, the presence of an ohmic resistor of high value is avoided, a saving of space is obtained in the integrated circuit which is all the larger the smaller the resistivity in the circuit.

Furthermore, it has been possible to observe that the overall capacitance to earth of the circuit according to the invention, incorporated into an integrated circuit, can be smaller than the stray capacitance of a circuit which uses an ohmic resistor made in a resistive layer.

It has also been seen that the shape of the transfer curve of the active component forming the equivalent resistor can be programed by appropriately modifying the values of the capacitances of the capacitive divider 13. Furthermore, the slope of this characteristic is hardly dependent on the currents present in the components of the arrangement.

Finally, the circuit has favourable behaviour in terms of frequency, since the offset in the DC level of the output voltage is independent of frequency in as much as the latter exceeds a predetermined lower limit.

What is claimed is:

1. A bias circuit for setting the mean level of an AC voltage comprising a series arrangement including a capacitive element (C) and an active component (M10; M12; M19; M20; M24) having a conductance and forming an equivalent resistor, said capacitive element and said active component having a node therebetween, a DC current source (12; $I^{p1}$, $I_{p2}$, M17, M18; $I_{p1}$, $I_{p2}$, M21, M22) coupled to said active component and means (M11, 11, M13, M14, M15, 11) for altering the conductance of said active component and for fixing the mean level of said AC voltage, said AC voltage ($U_{ac}$) being applied to said series arrangement, wherein a bias voltage having a desired mean level ($U_{out}$) is tapped off from the node (10) between said capacitive element (C) and said active component, said bias circuit further comprising means of modulation (13) coupled to said AC voltage for modulating a DC current (i) passing through said active component (M10; M12; M19, M20; M24) with a fraction of said AC voltage to be biased.

2. The circuit as claimed in claim 1, wherein said active component has a terminal and said means of modulation comprise a capacitive divider (C1, C2) whose middle point is joined to said terminal of said active component (M10; M12; M19; M20; M24).

3. The circuit as claimed in either one of the preceding claims, wherein said active component is a MOS transistor (M10; M12; M19; M20; M24).

4. The circuit as claimed in claim 3, when claim 3 depends on claim 2, wherein said middle point of said divider (13) is joined to the gate of said MOS transistor (M10; M24) and wherein the AC voltage ($U_{ac}$) is applied to the source of said transistor.

5. The circuit as claimed in claim 3, taken in combination with claim 2, wherein said middle point of the divider (13) is joined to the source of said MOS transistor (M12; M19; M20) and wherein said AC voltage ($U_{ac}$) is applied to the gate of said MOS transistor.

6. The circuit according to claim 1, wherein said series arrangement of said capacitive element (C) and said active element (M10; M12; M19; M20; M24) also comprises a source (11) of a reference voltage.

7. The circuit as claimed in claim 1, wherein said current source comprises a current mirror (M14, M15; M17, M18).

8. The circuit as claimed in claim 1, wherein said capacitive element is connected upstream (C) or downstream (Ca) of said means of modulation (13) in relation to the application of said voltage to be biased ($U_{ac}$).

* * * * *